(12) United States Patent
Mavoori et al.

(10) Patent No.: US 7,525,349 B2
(45) Date of Patent: Apr. 28, 2009

(54) CIRCUIT FOR CLASSIFYING SIGNALS

(75) Inventors: Jaideep Mavoori, Bellevue, WA (US); Chris Diorio, Seattle, WA (US)

(73) Assignee: University of Washington, Seattle, WA (US)

( * ) Notice: Subject to any disclaimer, the term of this patent is extended or adjusted under 35 U.S.C. 154(b) by 256 days.

(21) Appl. No.: 11/504,390

(22) Filed: Aug. 14, 2006

(65) Prior Publication Data
US 2008/0125989 A1 May 29, 2008

(51) Int. Cl.
H03K 5/22 (2006.01)
(52) U.S. Cl. .......................... 327/74; 327/75; 324/76.83
(58) Field of Classification Search ............... 327/74, 327/75; 324/76.83
See application file for complete search history.

(56) References Cited

U.S. PATENT DOCUMENTS

| | | | | |
|---|---|---|---|---|
| 4,317,080 | A * | 2/1982 | Acker | 327/74 |
| 5,059,892 | A * | 10/1991 | Stoft | 324/73.1 |
| 6,686,780 | B2 * | 2/2004 | Kimura et al. | 327/115 |
| 6,985,768 | B2 | 1/2006 | Hemming | |
| 7,034,603 | B2 * | 4/2006 | Brady et al. | 327/538 |
| 7,049,872 | B2 | 5/2006 | Diorio et al. | |
| 7,187,318 | B1 * | 3/2007 | Lee et al. | 341/161 |
| 2005/0204820 | A1 * | 9/2005 | Treiber et al. | 73/649 |

OTHER PUBLICATIONS

Diorio, C., et al., "A High-Resolution Nonvolatile Analog Memory Cell," *Proceedings of the IEEE International Symposium on Circuits and Systems*, Seattle, Wash., Apr. 30-May 3, 1995, vol. 3, pp. 2233-2236.

Köhler, B.-U., et al., "The Principles of Software QRS Detection," *IEEE Engineering in Medicine and Biology* 21(1):42-57, Jan./Feb. 2002.

Lewicki, M.S., "A Review of Methods for Spike Sorting: The Detection and Classification of Neural Action Potentials," *Network: Computation in Neural Systems* 9(4):R56-R78, Nov. 1998.

O'Driscoll, S., et al., "Neurons to Silicon: Implantable Prosthesis Processor," *Proceedings of the IEEE International Solid-State Circuits Conference*, San Francisco, Calif., Feb. 5-9, 2006, pp. 552-553, 672.

(Continued)

*Primary Examiner*—Timothy J Dole
*Assistant Examiner*—John Zhu
(74) *Attorney, Agent, or Firm*—Christensen O'Connor Johnson Kindness PLLC

(57) ABSTRACT

A circuit for classification of analog input signals, comprising an analog memory component, such as a floating gate, used to store a threshold value; a threshold detection module used to determine whether the analog input signal exceeds the threshold value; a time delay module used to delay a processing of the analog signal; a time-amplitude window calculation module used to determine whether an amplitude of the analog input signal is between a lower limit and an upper limit of an amplitude window; and an output module indicating whether the amplitude of the analog signal is between the lower and the upper limit, wherein the indication is used to determine whether the analog input signal belongs to one of a plurality of analog signal classes. The classification is implemented in the analog domain, eliminating the need for sampling and digitizing the analog signal, consequently minimizing circuit area and power.

22 Claims, 10 Drawing Sheets

OTHER PUBLICATIONS

Chakrabartty, S., and G. Cauwenberghs, "Sub-Microwatt Analog VLSI Support Vector Machine for Pattern Classification and Sequence Estimation," Advances in Neural Information Processing Systems 17, NIPS 2004, Vancouver, Canada, Dec. 13-18, 2004, 8 pages.

Donoghue, J.P., "Connecting Cortex to Machines: Recent Advances in Brain Interfaces," Nature Neuroscience 5 (Suppl):1085-1088, Nov. 2002.

Harrison, R.R., et al., "A Low-Power Microchip for a Wireless 100-Electrode Neural Recording System," 35th Annual Meeting of the Society for Neuroscience, Washington, D.C., Nov. 12-15, 2005, Abstract.

Nicolelis, M.A.L., "Actions from Thoughts," Nature 409:403-407, Jan. 18, 2001.

Schwartz, A.B., "Cortical Neural Prosthetics," Annual Review of Neuroscience 27:487-507, Jul. 2004.

* cited by examiner

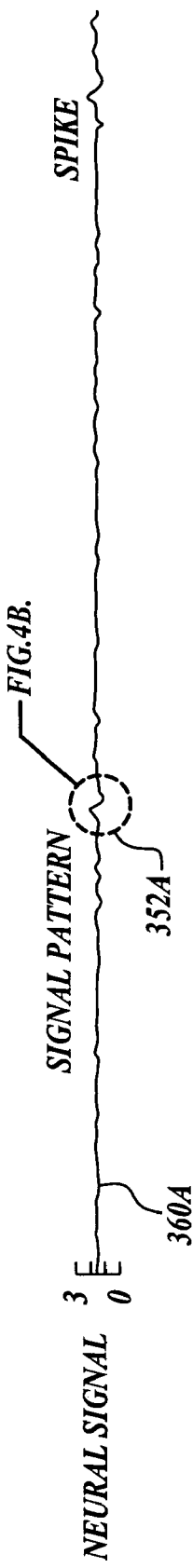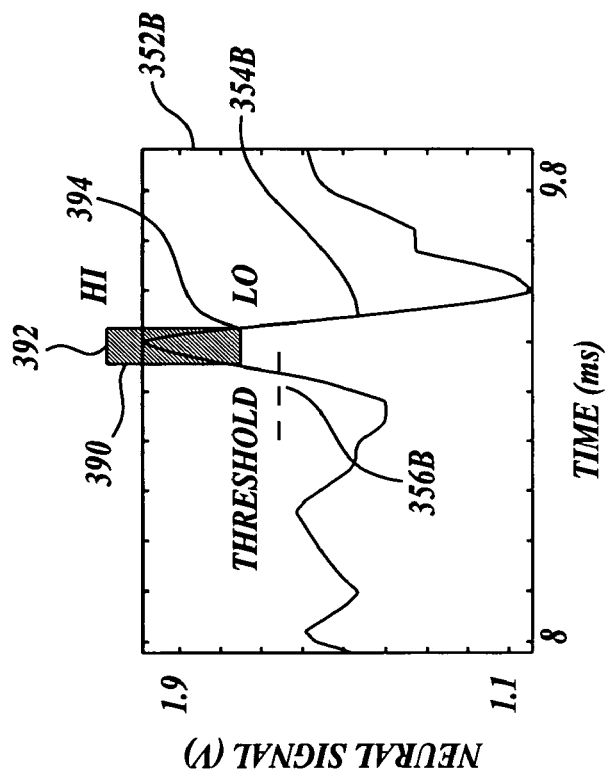
Fig.4A.
Fig.4B.

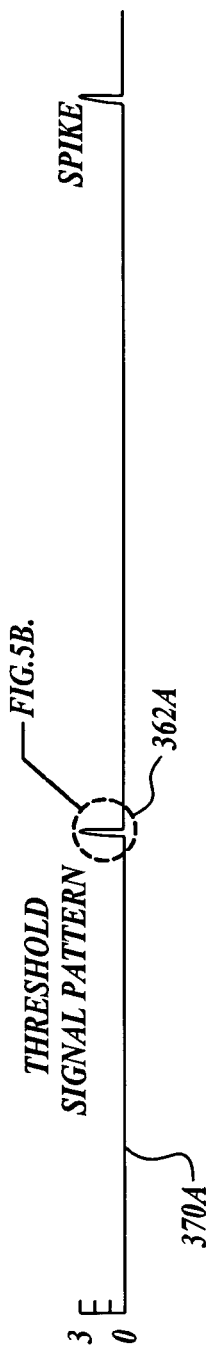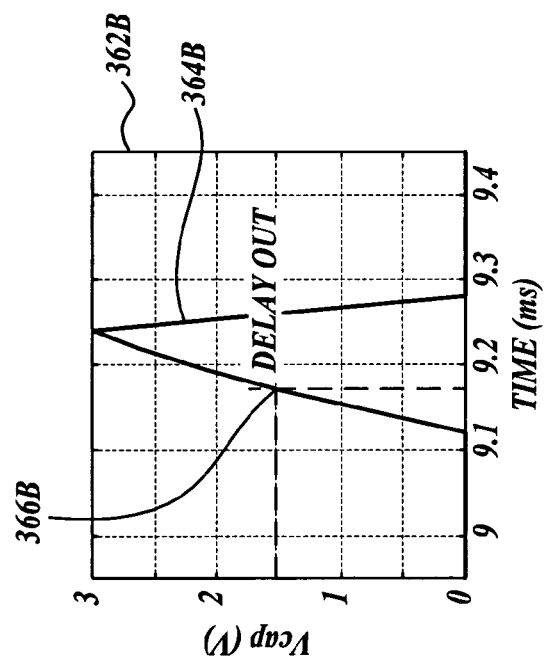
Fig.5A.
Fig.5B.

CIRCUIT FOR CLASSIFYING SIGNALS

STATEMENT OF GOVERNMENT LICENSE RIGHTS

This invention was made with government support under Grant No. N00014-01-1-0676 awarded by the Office of Naval Research, Virginia. The government has certain rights in the invention.

FIELD OF THE INVENTION

The present invention generally relates to classifying signals and, more specifically, relates to a method and a system for classifying analog input signals using analog memory components and, thus, eliminating the need for digitization of the analog signal.

BACKGROUND

Many industrial, scientific, and medical applications require the capture and classification of analog signals from analog signal sources such as sensor devices. Signals carry various types of information corresponding to physical phenomena. For example, in response to incident light, an electronic photosensor outputs a voltage proportional to the intensity of the incident light. The output voltage is an analog signal that may be detected and classified to identify certain characteristics of the light source, such as light intensity. Other applications include classification of signals output from pressure transducers, thermal sensors, and biomedical devices. Events in the physical sources of signals are manifested in the form of signal features, such as time-amplitude patterns or signatures, generated by the sensor device in response to such events. For example, a sudden rise in pressure may be manifested in the form of a pulse (a sharply rising and falling signal) in the output of a pressure transducer. Depending on the application, the method and apparatus for signal classification varies. For example, in some applications, such as control of machinery, real-time signal processing is required. In other applications, the signal generated from the sensor device may be digitized and stored for later processing. Generally, processing and classification of signals may be performed in a single apparatus or distributed across several devices and systems, depending on application requirements. In applications where power and space are not constrained, the signal from a sensor device may be transmitted to another device or system, such as a digital computing device, for processing. Alternatively, the sensor device and the processing device may be housed in a single apparatus. Various system configurations for signal acquisition and processing are determined based on many factors including cost of equipment, flexibility of operations, power and space constraints, and specific application constraints and requirements. For example, a laboratory setting for measurement of pressure in a pressure vessel imposes different requirements than pressure measurements in a running engine on board a moving vehicle.

Signals output from sensor devices are generally analog signals. Classifying signals may be done digitally or using analog techniques. Digitization of signals provides certain advantages such as flexibility, storage for future processing, and record keeping. On the other hand, signal digitization requires additional hardware, which increases cost and time of processing. Additional hardware also requires additional power and space, so that systems used for processing of digitized signals consume more power and are bulkier. In some applications, the additional size and power consumption cause serious problems to the point that the application may not be possible or practical.

In biomedical applications such as design of biomedical devices like pacemakers and neural implants, classification of patterns and waveforms present in physiological signals is often essential. Waveforms in physiological signals are classified for several reasons, including (1) detecting abnormalities so a corrective action or diagnosis can be performed; and (2) correlating with other signals or behavior for physiological system identification. One method of classifying waveforms and temporal signals includes verifying the waveforms' compliance to a set of amplitude windows. For example, a neurophysiological signal's waveform can be classified by specifying a threshold, voltage ranges in the amplitude window, and time delay from a threshold-crossing to the amplitude window. Classification methods based on the amplitude window techniques are well known in the art and may be easily implemented using software or digital hardware. However, as indicated above, system configurations requiring digitization of signals and processing of the digitized signals require additional power and hardware, making certain biomedical applications, such as neural implants, unfeasible.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

The present invention provides a circuit and a method for classifying analog signals using analog memory components, thus eliminating the need for digitizing the analog signal. In one aspect, a circuit is provided for classification of analog input signals comprising a first analog memory component used to determine a threshold value; a threshold detection module used to determine whether the analog input signal exceeds the threshold value; a time delay module used to delay a processing of the analog input signal by an amount equal to a window time delay; a time-amplitude window calculation module used to determine, after a lapse of the window time delay, whether an amplitude of the analog input signal is between a lower limit and an upper limit of an amplitude window; and an output module providing an indication of whether the amplitude of the analog input signal is between the lower limit and the upper limit of the amplitude window, wherein the indication is used to determine whether the analog input signal belongs to at least one of a plurality of pre-determined classes of analog signals.

In another aspect, an array of analog circuits is provided for applications where multiple signals must be analyzed simultaneously. For example, for monitoring brain waves, simultaneous analysis of multiple signals is required. In such applications, an integrated array of multiple analog signal classifiers may be used, wherein each analog signal classifier receives a different analog signal. In this aspect, the present invention provides an array of analog circuits for detection of patterns of analog input signals comprising a plurality of input ports used to receive a plurality of analog input signals; a plurality of circuits, corresponding to the plurality of the input ports, each used to receive one of the plurality of the analog input signals. Each circuit comprises a first analog memory component used to store a threshold value; a threshold detection module used to determine whether the analog input signal exceeds the threshold value; a time delay module used to delay a processing of the one of the analog input signals by an amount equal to a corresponding window time delay; a time-amplitude window calculation module used to determine, after a lapse of the corresponding window time delay, whether an amplitude of the one of the analog input signals is between a corresponding lower limit and a corresponding upper limit of a corresponding amplitude window. The array of analog circuits further comprises an output module providing an indication of whether the amplitude of the one of the analog input signals is between the corresponding lower and the corresponding upper limit of the corresponding amplitude window, wherein the indication is used to determine whether the one of the analog input signals belongs to at least one of a plurality of pre-determined classes of analog signals; and an array control module operative to select one of the plurality of the circuits.

Yet another aspect of the present invention provides a method for classification of analog signals comprising receiving an analog input signal; in response to receiving the analog input signal, detecting an amplitude of the analog input signal crossing a threshold stored in a first analog memory component. The method further comprises, in response to detecting the amplitude of the input signal crossing the threshold, waiting an amount of time and comparing the amplitude of the input signal to a lower and an upper limit of an amplitude window; indicating whether the amplitude of the analog input signal is between the lower and the upper limits of the amplitude window. The indication is used to determine whether the analog input signal belongs to at least one of a plurality of pre-determined classes of analog signals.

Yet another aspect of the present invention provides a method for detection of signal patterns comprising receiving a plurality of analog input signals; in response to receiving each one of the plurality of analog input signals, detecting an amplitude of each one of the analog input signals crossing a corresponding threshold. The method further provides for each of a plurality of positive amplitude peaks and each of a plurality of negative amplitude peaks of each of the plurality of the analog input signals, respectively, waiting a corresponding amount of time, stored in a corresponding first analog memory component, and comparing the positive amplitude peak and the negative amplitude peak of each of the plurality of analog input signals, respectively, to one of a plurality of lower limits and one of a plurality of upper limits, respectively, of a plurality of corresponding amplitude windows and indicating whether each of the positive amplitude peaks and each of the negative amplitude peaks of each of the analog input signals is between the corresponding one of the plurality of the lower limits and the corresponding one of the plurality of the upper limits. The method finally provides a step of determining, based on the indication for each of the analog input signals, whether each of the analog input signals matches one of a plurality of predetermined signal patterns.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein:

FIG. 4A is a pictorial diagram depicting a sample neural signal including a spike;

FIG. 4B is a pictorial diagram depicting a sample amplitude window;

FIG. 5A is a pictorial diagram of a sample thresholded neural signal including a spike;

FIG. 5B is a pictorial diagram depicting a thresholded neural signal spike;

DETAILED DESCRIPTION

Figure 1A:
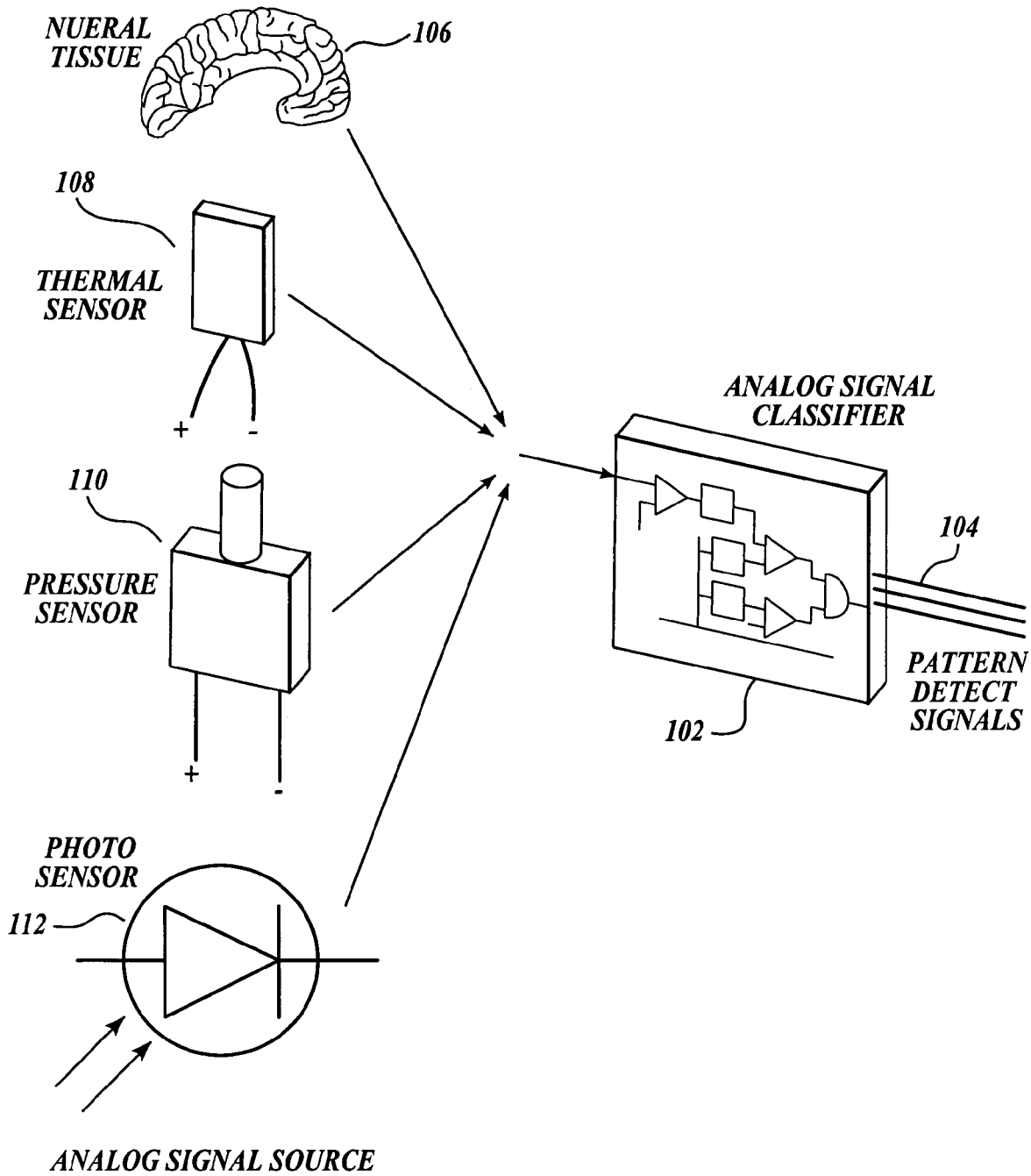
FIG. 1A is a pictorial diagram of a sample operating environment for an analog signal classifier formed in accordance with one embodiment of the invention.

In certain medical, scientific, and industrial applications, power and space constraints require the use of minimal electronic hardware components. In such applications, system configuration and processing techniques are determined so as to satisfy the power and space constraints. Additionally, in some applications, real-time processing of signals is required, precluding non-real-time processing techniques such as store-now and process-later techniques of data processing. Furthermore, sometimes application flexibility requires the use of single-device system configurations. For example, in biomedical applications, such as neural implants, a small device such as an electronic chip may be directly coupled with neural tissue to collect neural signals, classify them, and report the results in real-time. In such applications, processing of the analog signal directly by analog circuits using analog techniques of signal processing, such as comparing signal values to reference values, may satisfy power, space, and flexibility requirements of the application. Accordingly, in one embodiment of the invention, an analog signal classifier device may be used to measure neural signals from neural tissue, threshold the neural signal, and compare the neural signal to preprogrammed reference values. An output of the analog signal classifier device may subsequently classify the signal as belonging to one of a set of predetermined classes of signals. Other applications include motion activity detectors with embedded analog signal classifier devices reporting different types of motion activity in real-time, embedded analog signal classifier devices for real-time detection and reporting of preclassified pressure and temperature patterns in a chemical processing apparatus, etc.

Although the above description refers to a single input analog signal classifier device, in other embodiments, multiple input analog signal classifier devices may be used. In yet other embodiments, an array of analog signal classifier devices may be used, each device having a separate input and a separate output selectable by a controller. In yet another embodiment, the analog signal classifier device may be part of a more extensive system configuration including other systems and devices for further signal and data processing using digital computing devices.

The following detailed description describes illustrative embodiments of the invention. Although specific operating environments, system configurations, user interfaces and flow diagrams may be illustrated and/or described, it should be understood that the examples provided are not exhaustive and do not limit the invention to the precise forms and embodiments disclosed. Persons skilled in the field of electronics and signal processing will recognize that components and process elements described herein may be interchangeable with other components or elements, or combinations of components or elements, and still achieve the benefits and advantages of the invention. In addition, although the present description may refer to MOSFET transistors, comparators, and logic gates, persons skilled in the art will recognize that other types of transistors and electronic components may also be suitable.

In the following description, numerous specific details are set forth in order to provide a thorough understanding of the invention. However, it will be apparent to one skilled in the art that the invention may be practiced without some or all of these specific details. In other instances, well-known process elements have not been described in detail in order not to necessarily obscure the invention.

FIG. 1A is a pictorial diagram of a sample operating environment for an analog signal classifier. Analog signals may come from many different sources, most notably, sensor devices. Sensor devices may include, but are not limited to, photo sensors, pressure transducers, thermal sensors and thermistors, and biological sources such as neural tissue and blood chemical concentrations. Generally, a signal is a variable quantity, most often in the form of a time varying voltage. Most sensor devices take as input some physical quantity such as pressure, light, temperature, or other physical quantities and provide a voltage output usually proportional to the input quantity. The illustrated operating environment includes an analog signal classifier 102 which takes, as input, signal from an analog signal source such as neural tissue 106, thermal sensor 108, pressure sensor 110, or photo sensor 112. Those skilled in the art will recognize that the analog classifier 102 may be used with various other analog signal sources without departing from the spirit and scope of this disclosure. The analog signal classifier 102 produces pattern detect signals 104 based on the signal from the analog signal sources indicated above. Patterns are identifying characteristics indicative of the system function being monitored. For example, in neural signals, a threshold crossing and timing of the peaks and troughs relative to the threshold crossing may be identifying characteristics of a spike pattern. Pattern detect signals 104 may be combined together using logic circuits or digital computing devices to classify additional signal patterns. For example, if the spike detect signals 104 indicate that there were two spikes present with a certain predefined amplitude and certain relative timing, then the two successive spikes detected this way may constitute a predefined pattern or class of signal.

Figure 1B:
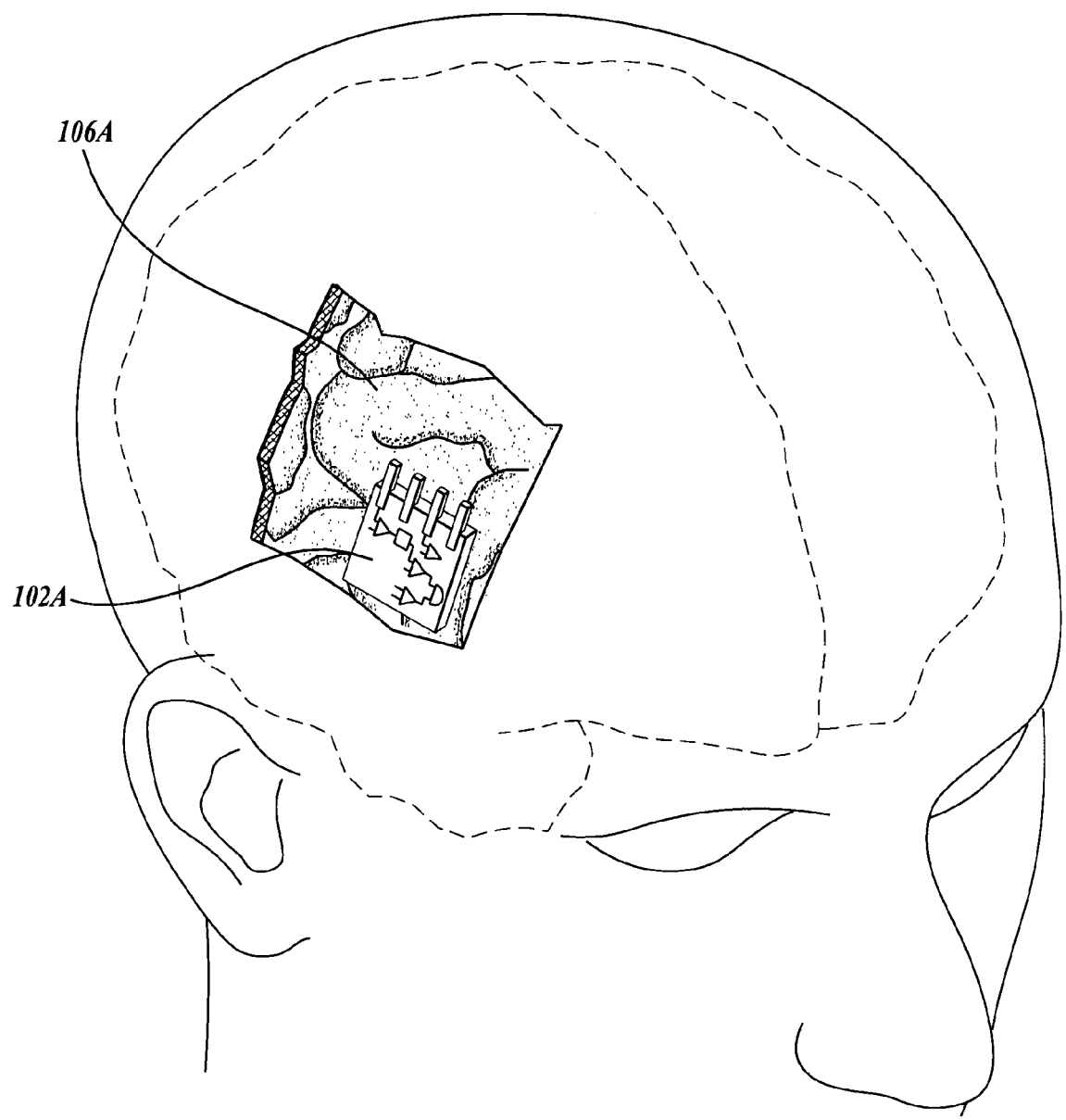
FIG. 1B is a pictorial diagram of a sample operating environment for an analog signal classifier coupled with neural tissue.

FIG. 1B is a pictorial diagram of a sample operating environment for an analog signal classifier 102A coupled with, for example, neural tissue 106A. Neural implants are biomedical devices which are usually directly (via intracortical electrodes) or indirectly (via electroencephalogram or electrocorticogram) coupled to neural tissue. In recent years, neural implants have been used to correct human sensory problems resulting from neural impairments. For example, cochlear implants have been used to correct inner ear problems, also referred to as nerve deafness. Other applications include neural implants for visual impairment and various forms of memory impairments. Neural implants may also be used to treat brain disorders such as epilepsy and seizures. Use of such treatments often requires detection of certain signal patterns in the neural tissue, based on which the neural implant device may produce electrical stimulation of the neural tissue to compensate for the impairment in real-time. In other embodiments, the neural implant may be connected to external devices via wireless or wired transmission to provide information for further analysis. Those skilled in the art will appreciate that biomedical devices are not limited to neural implants and include devices coupled to other tissue and organs such as blood and heart to collect biological information such as chemical concentrations, pressure, and thermal information.

Figure 2A:
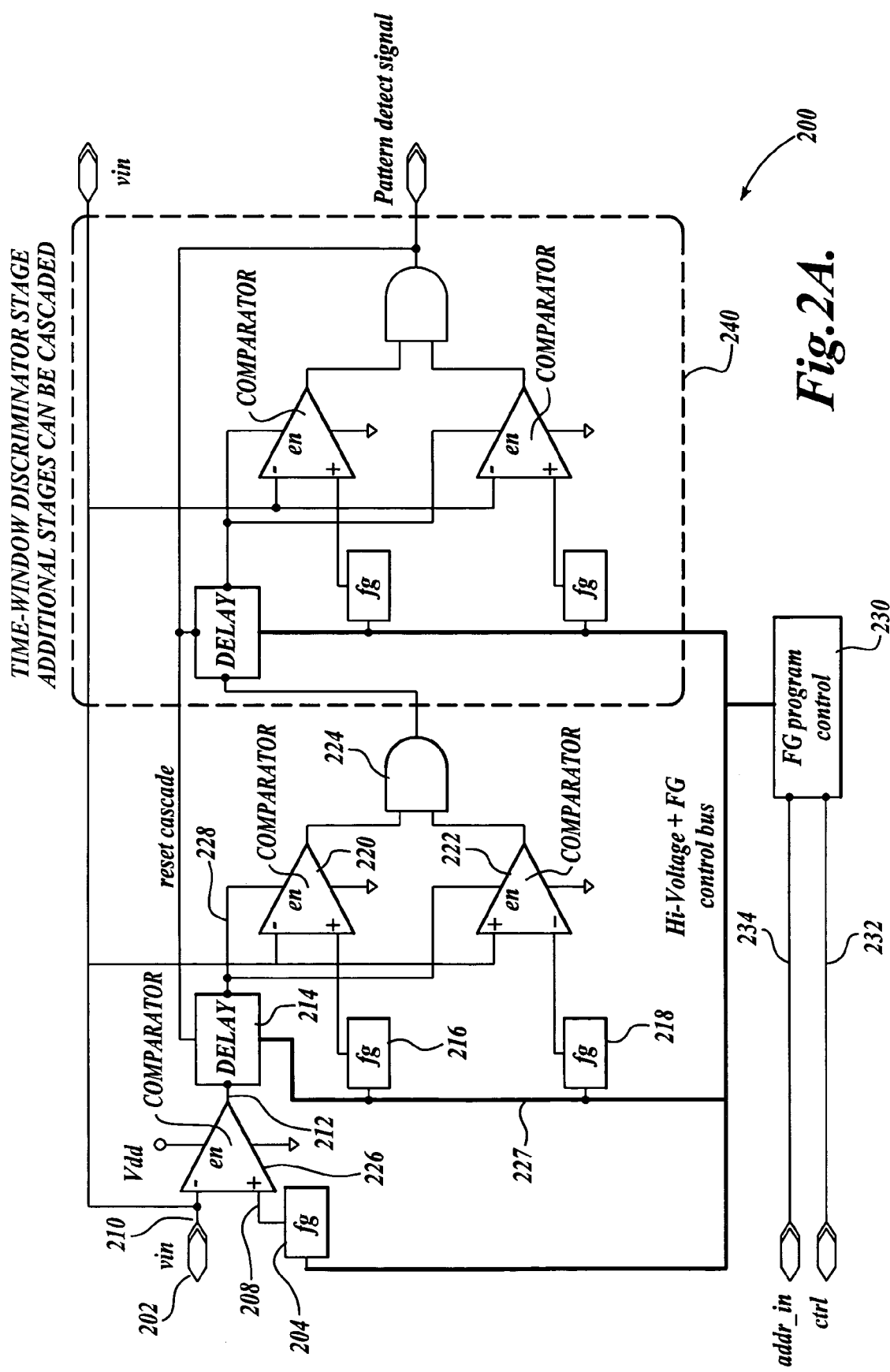
FIG. 2A is a block diagram depicting an embodiment of an analog signal classifier formed in accordance with one embodiment of the invention.

FIG. 2A is a block diagram depicting an embodiment of an analog signal classifier 200 that may be used, for example, in conjunction with a neural implant. Analog processing of signals is generally done by electronic circuits using hardware components only. The hardware components include transistors, operational amplifiers, resistors, capacitors, diodes, etc., which may also be used in digital circuits. Analog processing is performed in analog domain, wherein a continuous, as opposed to a discrete, signal is processed. In analog domain, the value of the continuous signal at any moment in time is represented by a proportional physical quantity, such as voltage, instead of a number as is done in digital domain. This is in contrast to circuits used in digital computing devices where signals are first digitized and operation of the digital electronic components may be controlled by software programs. Types of analog signal processing include delay of signal, amplification of signal, filtration of signal, comparison of signal to predetermined reference values, and enabling or inhibition of signal output from components. An analog signal classifier may use temporal and spectral signal characteristics such as amplitude and frequency of the signal to classify the signal. For example, using a delay component to specify the time of occurrence of a signal spike, a signal classifier can classify the signal based on the timing of the signal spike relative to other events, such as crossing a signal threshold. In the illustrated embodiment, the analog classifier 200 includes a first floating gate 204 connected to a noninverting input 208 of a comparator 226. The inverting input 210 of the comparator 226 is coupled to an input signal 202. The output 212 of the comparator 226 is coupled with the input of the delay component 214. The output 228 of the delay component 214 is connected to a comparator 220 and a comparator 222 to enable the output of the comparators 220 and 222. A second floating gate 216 is coupled with the noninverting input of comparator 220, the inverting input of which is connected to the input signal 202. A third floating gate 218 is coupled with the inverting input of the comparator 222, the noninverting input of which is connected to input signal 202. The outputs of comparator 220 and 222 are coupled to the input of a logic gate 224. The output of the logic gate 224 may be coupled to a next stage 240 which is identical to a previous stage as described above. A high voltage bus 227 is coupled with all floating gate devices 204, 216, 218, and the delay component 214. A floating gate program control 230 is coupled to the floating gate devices 204, 216, and 218 to program the charge stored in the floating gate components. A floating gate to be programmed is selected using address lines 234 and programmed using control lines 232. The high voltage bus 227 provides appropriate voltages needed to tunnel or inject charge to be stored in the floating gates 204, 216, and 218. As further described below, floating gates may be used as analog memory components to store analog information, such as reference values for comparison with signal amplitudes to detect signal events, thus eliminating the need for additional hardware to digitally store reference values and digitize the analog input signal for comparison with the digitally stored reference values.

In operation, in the illustrated embodiment, the signal classification is performed in three stages. In stage one, a threshold crossing of the input signal is detected. In stage two, a signal processing delay is started, at the end of which, an amplitude window comparison is performed, which determines whether a signal pattern, such as a spike, falls within an upper and a lower limit of the amplitude window. In stage three, an output signal indicates whether the input signal belongs to a predefined class or pattern of signals.

Now, with reference to FIG. 2A, in stage one, the input signal 202 is sensed by the comparator 226 and compared with the analog value stored in floating gate 204. If the value of the input signal 202 exceeds a threshold value represented by the charge stored in floating gate 204, the output of comparator 226 starts the delay element 214, and stage two, which delays the further processing of the input signal 202 by a predetermined amount of time. The comparator 220 and the floating gate component 216 form the upper limit of an amplitude window. Similarly, the comparator 222 and floating gate component 218 form the lower limit of the amplitude window. The input signal 202 is simultaneously compared with the upper limit of the amplitude window represented by the value stored in the floating gate 216 and the lower threshold of the amplitude window represented by the value stored in floating gate 218, respectively. In stage three, the comparators 220 and 222 output a signal to indicate whether the input signal 202 has exceeded either of the upper and lower limits, respectively. If the signal amplitude is between the lower and upper limits of the amplitude window, then the output of the logic gate 224 is enabled and processing further continues with a next optional stage of classification using hardware stage 240. Multiple additional hardware stages 240 may be cascaded, as shown in FIG. 2A, to process multiple successive signal spikes, based on which the input signal is classified. Each additional hardware stage 240 may implement a different delay period and amplitude lower and upper limits, corresponding to one of the successive signal spikes used in the classification of the input signal. Those skilled in the art will appreciate that other electronic components and circuit interconnections may be used to implement an amplitude window comparison without departing from the spirit of the present disclosure. For example, other types of analog memory components such as capacitors may be used to store reference values like thresholds and upper and lower window limits.

Figure 2B:
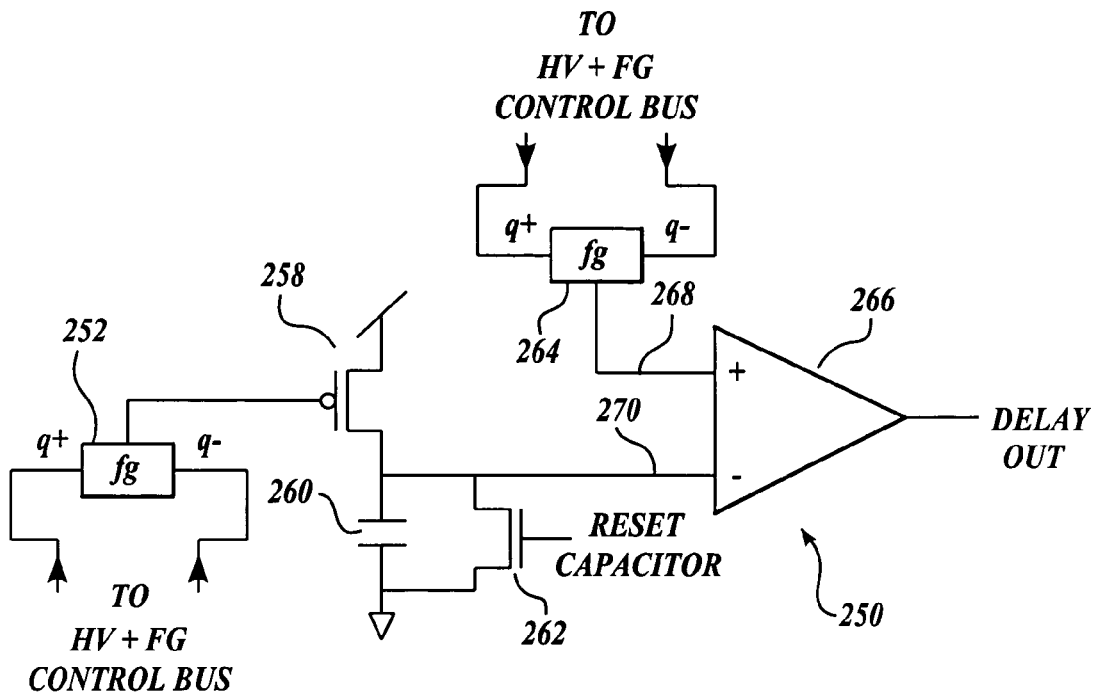
FIG. 2B is a block diagram depicting an embodiment of an analog delay component circuit shown in FIG. 2A.

FIG. 2B is a block diagram depicting an embodiment of an analog delay component circuit that may be used as the delay element 216 shown in FIG. 2A. Time delay is a common element in signal processing. One of the ways time delay elements are used is to delay the signal until a desired feature, such as a spike, arrives and can be processed. Time delay of a signal may be implemented using analog or digital techniques. Analog techniques of a signal delay often involve charge or discharge time associated with an electronic component such as a capacitor.

In one embodiment, a capacitor 260 is used as the primary source of time delay. A floating gate analog memory component 252 is coupled to the gate of a transistor 258. The drain of the transistor 258 is coupled with capacitor 260 and the source of transistor 258 is coupled to a voltage source. The other terminal of the capacitor 260 is connected to ground. A reset transistor 262 is used to discharge and reset capacitor 260. The drain of transistor 258 is further coupled to the inverting terminal 270 of an operational amplifier 266, the non-inverting terminal 268 of which is coupled with a floating gate 264.

In operation, the total time delay equals total charge on the capacitor 260 divided by rate of charge of capacitor 260, analogous to a time of travel, which equals distance divided by velocity. Floating gate 252 controls the gate, and consequently, the current through transistor 258. The current through transistor 258 in turn determines the charge rate of capacitor 260. Floating gate 264 stores a value corresponding to the maximum charge desired on capacitor 260. When the charge on capacitor 260 reaches the value stored in floating gate 264, the output of the operational amplifier 266 is activated, indicating the end of the delay period. Those skilled in the art will appreciate that other analog components and techniques may be used to implement a signal delay function without departing from the spirit of the present disclosure. Thus, as noted above, the delay component 214 may be used to specify the time at which a signal spike or other signal feature is processed by the signal classifier 200.

Figure 2C:
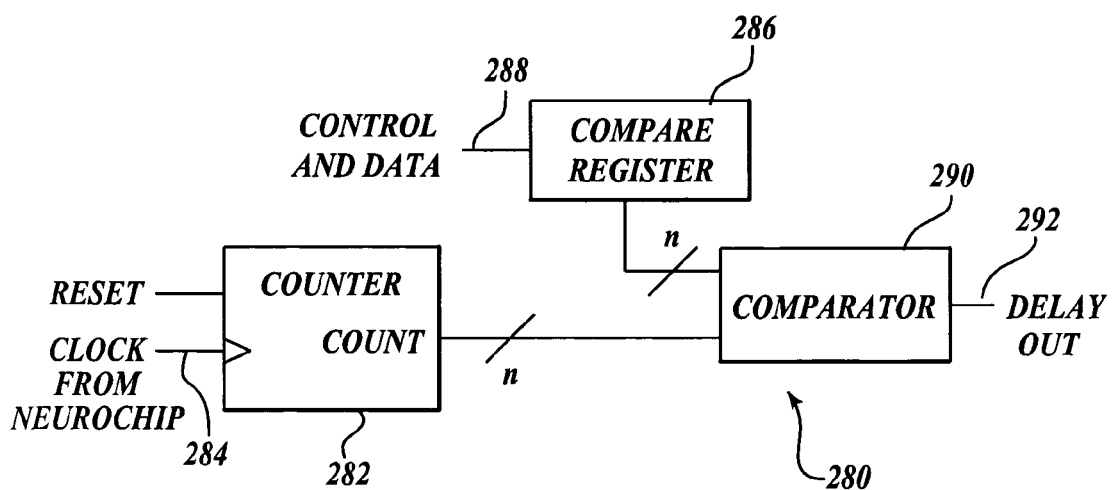
FIG. 2C is a block diagram depicting an embodiment of a digital delay component circuit shown in FIG. 2A.

FIG. 2C is a block diagram depicting an embodiment of a digital delay module that may be used as the delay element as shown in FIG. 2A. As noted above, delay of a signal may be implemented using digital techniques. In one embodiment, a digital counter 282 is used with a clock input 284 and an output coupled to the input of a comparator 290. A compare register 286 having a control and data input 288 is also coupled to another input of the comparator 290. The comparator 290 has delay output 292 for indicating the end of the delay period. In operation, the digital counter 282 counts the number of clock pulses 284 and outputs the running count which is used by comparator 280 to continuously compare with the values stored in the compare register 286. When the running count output from the digital counter 282 equals or exceeds the values stored in the compare register 286, the output of the comparator 280 is activated, indicating the end of the delay period. Those skilled in the art will appreciate that the digital delay module depicted in FIG. 2C may be implemented using other digital components and other techniques without departing from the spirit of the present invention.

In many applications, such as monitoring brain wave patterns, simultaneous analysis of multiple signals is required. In such applications, a single analog signal classifier is not sufficient. Multiple discrete analog signal classifiers may be used for such applications. However, the number of such discrete analog signal classifiers may be limited for practical reasons such as cost, space, wiring, etc. Thus, in applications where multiple signal channels are required, an integrated array of analog signal classifiers may be used. For example, a number of analog classifiers, such as the classifier 200 of FIG. 2A, may be integrated in an array of signal classifiers, as more fully described below.

Figure 2D:
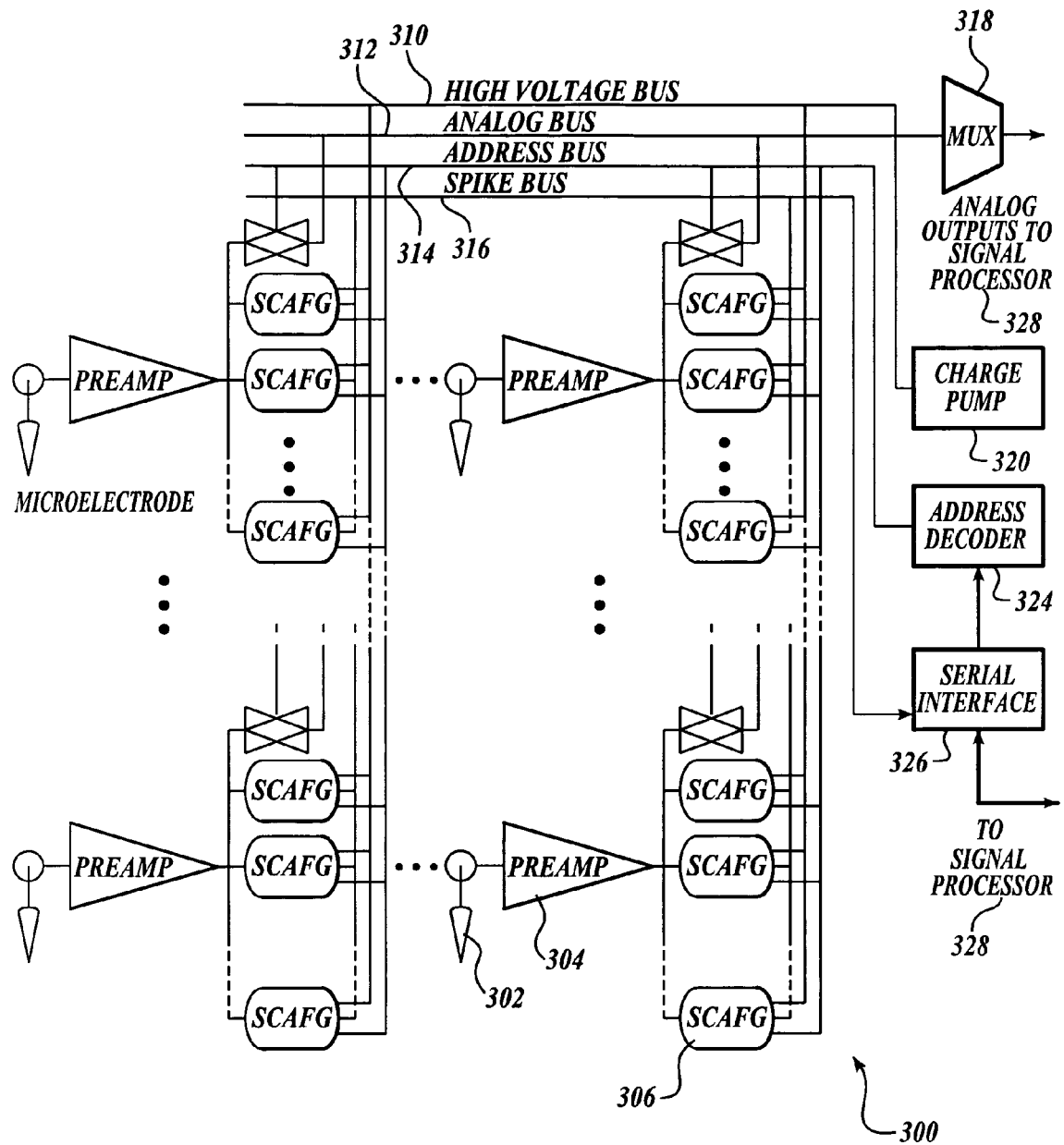
FIG. 2D is a block diagram depicting an embodiment of an array of analog signal classifiers.

FIG. 2D is a block diagram depicting an embodiment of an array of analog signal classifiers. As noted above, in one embodiment, an array of analog signal classifier devices may be used, each device having a separate input and a separate output selectable by a controller. In this embodiment, each analog signal classifier 306 is coupled to several electrical buses, including a high-voltage bus 310, an analog bus 312, an address bus 314, and a spike bus 316. As noted above, the high-voltage bus 310 is used to charge the floating gate analog memory devices included in each analog signal classifier 306. A microelectrode 302 is coupled to the source of the analog signal and provides the input to a preamplifier 304. The output of the preamplifier 304 is coupled with analog bus 312 providing access to the input analog signal. The address bus 314 is used to select one of the analog signal classifiers included in the array of analog signal classifiers 300. The spike bus 316 is used to provide access to the output of each selected analog signal classifier 306. A multiplexer 318 is used to select one of several signals provided by the analog bus 312. A charge pump 320 is used to provide the high voltage distributed by the high-voltage bus 310. An address decoder 324 is used to translate an address specified by a signal processor 328 to address lines included in the address bus 314 and select one of the analog signal classifiers 306 from the array of the analog signal classifiers 300. A serial interface 326 is used to transmit the spike detect signals provided by the spike bus 316 to the signal processor 328. Those skilled in the art will appreciate that other multi-classifier configurations are possible without departing from the spirit of the present disclosure. For example, a set of analog signal classifiers may be configured in a star architecture, a hierarchical architecture, or other architectures.

In operation, the illustrated embodiment provides multiple channels by using microelectrodes 302. The input signal provided by microelectrode 302 is amplified by the preamplifier 304 which provides the input to the analog signal classifiers 306. Each analog signal classifier 306 classifies the input signal as described above with respect to FIGS. 2A-2C. The signal processor 328 selects one of the multiple analog signal classifiers 306 from the array 300 using the address decoder 324 and the address bus 314. The analog bus 312 provides the input signal to the selected analog signal classifier 306 to the signal processor 328 through the multiplexer 318. The spike bus 316 provides the output of the selected analog signal classifier 306 to the signal processor 328 through the serial interface 326. The signal processor 328 further analyzes the inputs and outputs for each of the analog signal classifiers 306 in the array 300 individually and collectively as required by the application.

Figure 3:
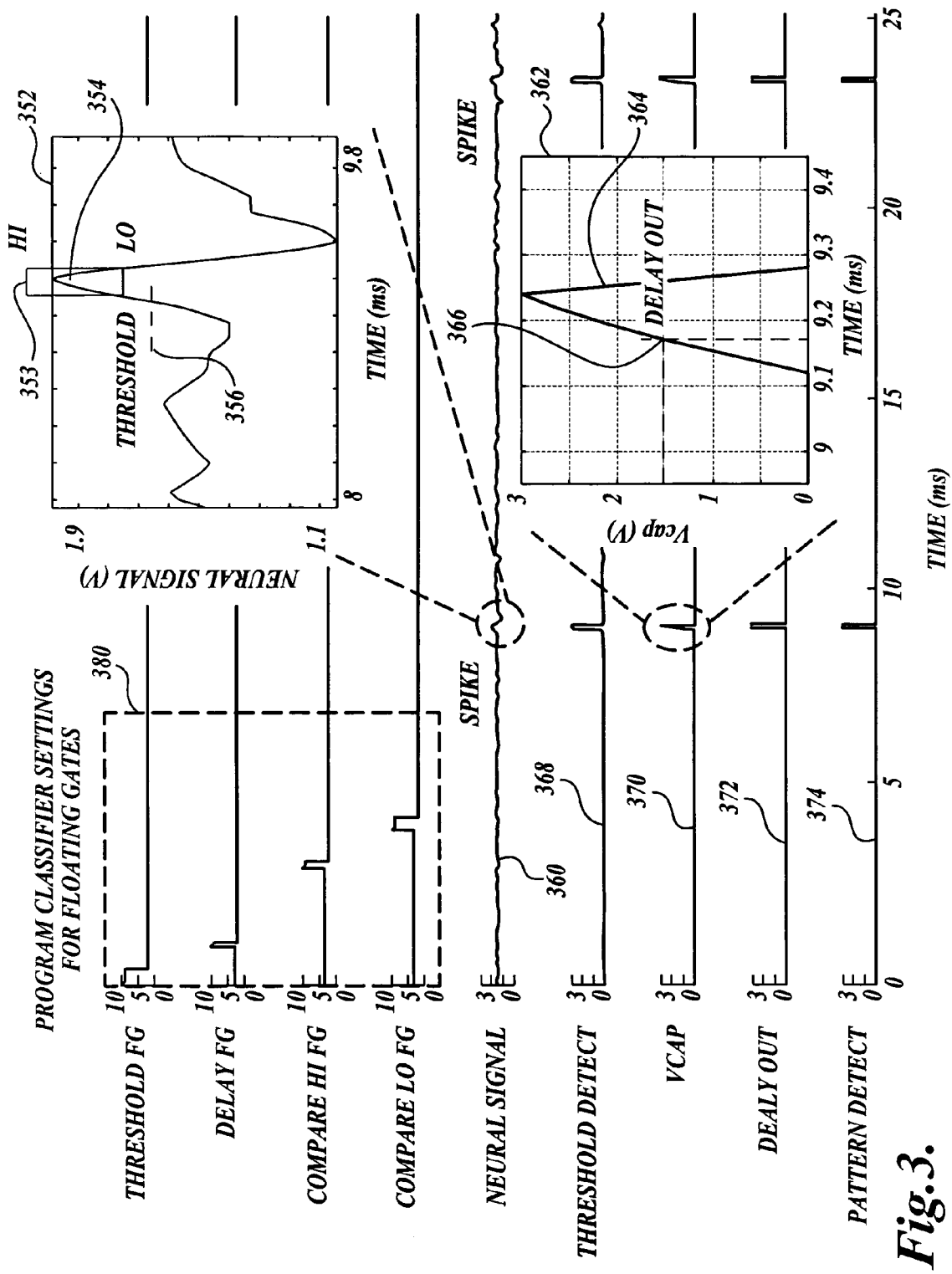
FIG. 3 is a pictorial diagram depicting a sample neural signal and related signal timings.

FIG. 3 is a pictorial diagram depicting a sample neural signal and related signal timings. As an input signal propagates through an analog circuit, at each node in the circuit some information is provided about the input signal. For example, the neural signal 360 includes a spike that is used to classify the input signal. Details of the spike are shown in subfigure 352, including a threshold value 356 and an amplitude window 353. With reference to FIGS. 2A and 3, the threshold detect signal 368 corresponds to the signal at the output of the comparator 226. Delay out signal 372 corresponds to the signal at the output of the delay module 214. Pattern detect signal 374 corresponds to the signal at the output of the logic gate 224. Programmed values stored in the floating gates 204, 216, and 218 are shown in area 380 of FIG. 3. Subfigure 362 shows the charging of capacitor 260 in the analog delay circuit 250 shown in FIG. 2B, and also depicts the details of the delay indication pulse 364. Some of the signals mentioned above are described in more detail below. For example, details of the signal spike 354 are discussed below.

FIG. 4A is a pictorial diagram depicting a sample neural signal including a spike. As noted above, a neural signal may be classified based on the timing and amplitude of spikes appearing in the neural signal. The exemplary neural signal 360A includes an exemplary spike 352A. The spike 352A is shown in greater detail in FIG. 4B. The exemplary threshold 356B is a value of the spike 354B at which the processing of the spike 354B and classification of the exemplary neural signal 360A starts. The exemplary spike value 356B is compared to the threshold value stored in the first floating gate analog memory 204 of FIG. 2A. The amplitude window 390, which is used to detect the existence of the spike 354B, includes a lower limit 394 and an upper limit 392. The upper limit 392 corresponds to the value stored in the second floating gate analog memory 216 and the lower limit 394 corresponds to the value stored in the third floating gate analog memory 218 of FIG. 2A. The amplitude window 390 is used to determine whether the spike 354B falls within the predetermined upper and lower limits 392 and 394, respectively. Once this determination is made, the analog signal classifier 200 outputs a corresponding spike detect signal 374 indicating the detection of such spike. Those skilled in the art will appreciate that the amplitude window depicted in FIG. 4B may similarly be applied to other peaks and valleys of the signal 360A.

FIG. 5A is a pictorial diagram of a sample thresholded neural signal including a spike. A thresholded signal is typically a pulse or other waveform resulting from comparison of an input signal with a reference value. A thresholded signal is typically used to show the time of the waveform appearing in the input signal. A thresholded signal usually does not include details of the input signal and is usually used only for timing information contained therein. The sample thresholded neural signal 370A includes a sample thresholded spike pattern 362A, which is shown in greater detail in FIG. 5B. The exemplary voltage level 366B corresponds to the value stored in floating gate analog memory 264 of FIG. 2B. With reference to FIG. 4B, when the threshold 356B is detected, a delay period is started at the end of which the amplitude window 390 is used to evaluate the spike 354B. With reference to FIG. 5B, the threshold 366B signifies the end of this delay period and the start of the time-amplitude window analysis. The same delay processing is performed for each successive hardware stage 240 shown in FIG. 2A.

Figure 6:
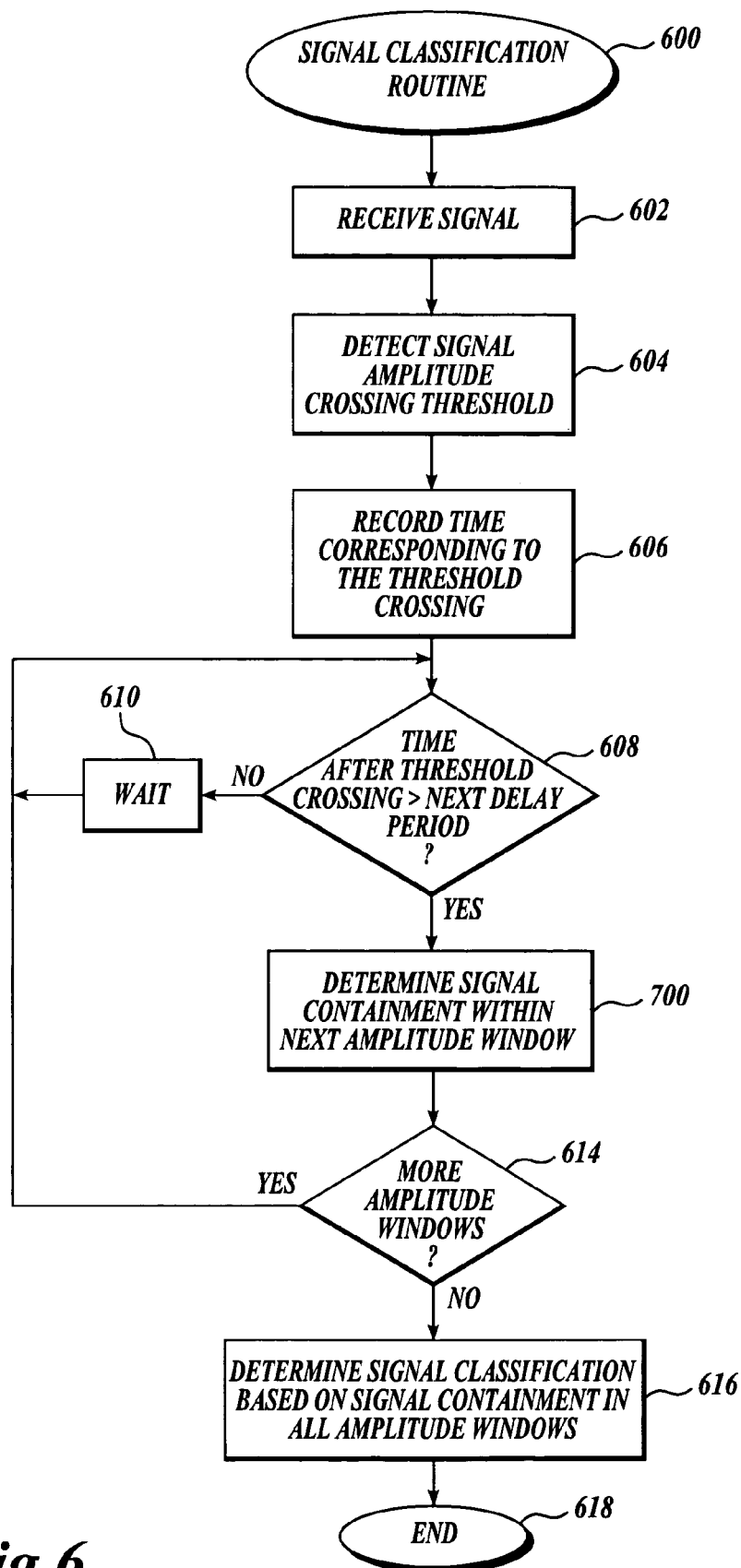
FIG. 6 is a flow diagram of a sample method of signal classification.

FIG. 6 is a flow diagram of a sample method of signal classification. As noted above, with respect to FIG. 2A, when an input signal 202 is analyzed by the analog signal classifier 200, the value of the input signal 202 is compared to the predetermined threshold value stored in the first floating gate 204 continuously. When the input signal 202 exceeds the threshold values stored in the first floating gate 204, a delay period is started using the delay module 214. When the delay period is completed, the comparators 220 and 222 are enabled by the output of the delay module 214 using output signal 228. The comparators 220 and 222 determine whether the spike detected in input signal 202 falls between an upper limit and a lower limit, stored in floating gate analog memories 216 and 218, respectively. The output of logic gate 224 indicates whether the spike was determined to be between the upper and lower limits of the amplitude window. As noted before, multiple cascaded hardware stages may be included in the analog signal classifier. Each such hardware stage implements a delay corresponding to an amplitude window for the respective hardware stage 240. The delay module 214 for each hardware stage 240 defines the timing of a corresponding spike in the input signal 202 to be analyzed using the corresponding amplitude window defined by the values that are stored in the respective floating gates 216 and 218. The sample method of signal classification shown in FIG. 6 describes a method of determining the time when the next amplitude window for the analysis and classification of the corresponding next signal pattern is used.

With respect to FIG. 6, the signal classification routine starts at block 600 and proceeds to block 602, where an input signal 202 is received by the analog signal classifier 200. At block 604, comparator 226 determines whether the threshold stored in the first floating gate 204 is exceeded by the input signal 202. At block 606, the corresponding time of the threshold crossing is recorded. In one embodiment, the recording of the time is performed by starting a delay module 214. At decision block 608, a next delay period is determined with respect to the time of threshold crossing determined in block 606. The next delay period is the delay period corresponding to an amplitude window used for detection of a corresponding spike in the input signal 202. In one embodiment, the next delay period is determined by time elapsed in the delay module 214, as described with respect to FIGS. 2B and 2C. While the next delay period has not terminated, the signal classification routine 600 waits in block 610 for more elapsed time going back to block 608. When the next delay period terminates, the routine 600 proceeds to block 700 (see FIG. 7) where input signal classification based on next amplitude window continues. At block 614, the routine 600 determines whether there are more amplitude windows remaining for the classification of the input signal 202. If more amplitude windows remain, the routine 600 proceeds to block 608; otherwise, the routine 600 continues to block 616 where signal classification is performed based on signal pattern containment in all amplitude windows analyzed. The routine 600 ends at block 618. Time-amplitude window algorithms may be implemented in various ways. In one embodiment, the peak of a signal spike is compared with an upper limit and a lower limit of the amplitude window, as described in more detail below.

Figure 7:
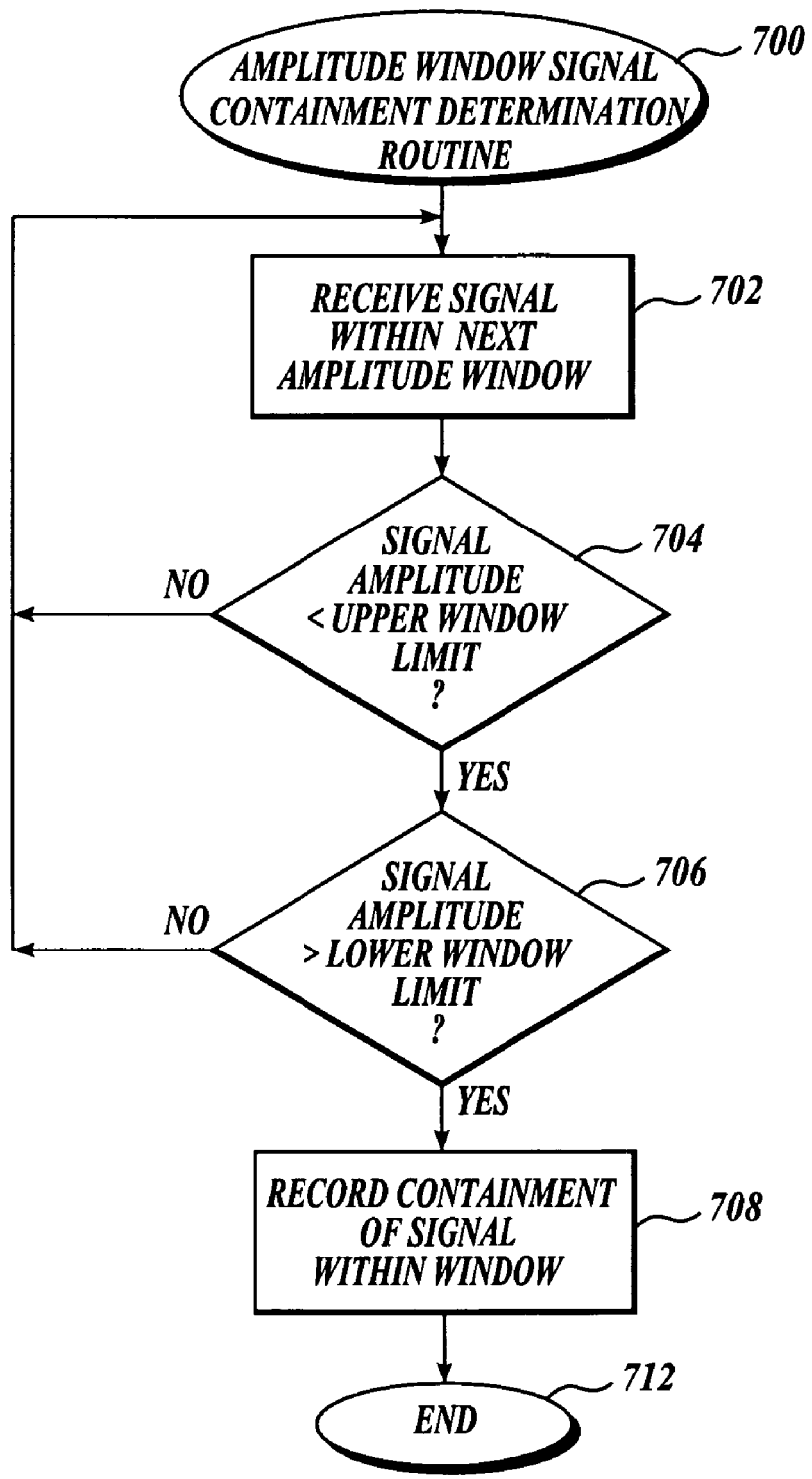
FIG. 7 is a flow diagram of a sample method of an amplitude window signal containment determination.

FIG. 7 is a flow diagram of a sample method of an amplitude window signal containment determination. As noted above, an input signal may be classified using one or more signal features such as spikes. Spikes may be characterized using a range of amplitudes of the spike peak or valley using an upper and lower limit for the spike amplitude. The amplitude window signal containment determination routine 700 proceeds to block 702 where an input signal 202 is received, having a signal pattern, such as a spike, that may be within the bounds of the next amplitude window. The routine 700 proceeds to decision block 704 where the received input signal amplitude is compared with the upper limit of the amplitude window to determine if the signal amplitude exceeds the upper limit. If the signal amplitude does not exceed the upper limit, the routine 700 proceeds back to block 702 to continue to receive the input signal 202 including a spike. If the signal amplitude is less than the upper limit of the amplitude window, the routine 700 proceeds to decision block 706 where the signal amplitude is compared with the lower limit of the amplitude window. If the signal amplitude is not greater than the lower limit of the time-amplitude window, the routine 700 goes back to block 702 to continue to receive input signal 202. If the signal amplitude is greater than the lower limit of the amplitude window, the routine 700 proceeds to block 708 where an indication of the containment of the spike included in the input signal 202 is recorded.

In one embodiment, the amplitude of the signal is compared with the upper limit and lower limit of the amplitude window using an electronic comparator and a reference value. The electronic comparator may be an operational amplifier with an inverting and non-inverting input. The operational amplifier outputs a signal when one of the inputs to the operational amplifier exceeds the other one. For example, if the non-inverting input exceeds the inverting input of the operational amplifier, the operational amplifier outputs a signal indicating so. In one embodiment, the reference value is stored in an analog memory, such as a floating gate transistor, connected to one of the inputs of the operations amplifier. In another embodiment, each of the lower and upper limits of the amplitude window is provided using one operational amplifier and a corresponding floating gate analog memory. Thus, an amplitude window is provided by two pairs of components, each pair including a floating gate analog memory and an operational amplifier used as a comparator. Each amplitude window thus constructed requires a delay element to match the time of occurrence of the spike in the input signal 202 with the corresponding amplitude window for the analysis of that spike. As noted above, the analysis of multiple successive signal patterns in the input signal 202 requires multiple corresponding delay elements and amplitude windows, each delay element matching the time of the occurrence of the corresponding signal pattern with the amplitude window for the analysis of the corresponding signal pattern. Routine 700 terminates at block 712.

Signal classification may be done using different methods. In one embodiment, the analog signal is classified based on the timing and size of the signal patterns it includes. For example, a heartbeat signal represents pressure variations in the heart and includes a certain pattern of spike peaks and valleys with certain relative timing. A healthy heartbeat may be distinguished based on such signal pattern. In another embodiment, signals may be classified based on predetermined signal patterns that are defined based on relative amplitude in the pattern, rather than pattern timing. For example, magnitude of seismic events, such as earthquakes, are determined primarily based on signal amplitudes. Those skilled in the art will appreciate that other types of signal classification and pattern matching may be performed using signal pattern timing and amplitudes without departing from the spirit of the present disclosure. For example, signal pattern timing and size data from multiple input signal channels may be used individually and/or collectively to classify events and distinguish patterns in the physical source of the input signals. Analysis of brain wave patterns, such as those generated during sleep, is one example of such methods.

While illustrative embodiments have been illustrated and described, it will be appreciated that various changes can be made therein without departing from the spirit and scope of the invention.

The invention claimed is:

1. An array of analog circuits for detection of patterns of analog input signals, the array of analog circuits comprising:
   a plurality of input ports operative to receive a plurality of analog input signals;
   a plurality of circuits, corresponding to the plurality of the input ports, each operative to receive one of the plurality of the analog input signals, the plurality of the circuits being connected to at least an address bus for selecting one of the plurality of the circuits, an analog bus for delivering the plurality of the analog input signals to a signal processor, and a spike bus for delivering the indications provided by each of the output modules of the plurality of the circuits to the signal processor, each circuit comprising:
   a first analog memory component operative to store a threshold value;
   a threshold detection module operative to determine whether the analog input signal exceeds the threshold value;
   a time delay module operative to delay a processing of the one of the analog input signals by an amount equal to a corresponding window time delay;
   an amplitude window calculation module operative to determine, after a lapse of the corresponding window time delay, whether an amplitude of the one of the analog input signals is between a corresponding lower limit and a corresponding upper limit of a corresponding amplitude window; and an output module providing an indication of whether the amplitude of the one of the analog input signals is between the corresponding lower and the corresponding upper limit of the corresponding amplitude window, wherein the indication is used to determine whether the one of the analog input signals belongs to at least one of a plurality of pre-determined classes of analog signals; and an array control module operative to select one of the plurality of the circuits, the array control module comprising an address decoder for selecting one of the plurality of the circuits using at least one of the address bus, the analog bus, and the spike bus.

2. The array of analog circuits of claim 1, wherein the plurality of the analog input signals are pre-amplified before being received by the plurality of the input ports.

3. A method for classification of analog signals, the method comprising:

receiving an analog input signal;

in response to receiving the analog input signal, detecting an amplitude of the analog input signal crossing a threshold stored in a first analog memory component;

in response to detecting the amplitude of the input signal crossing the threshold, waiting an amount of time and comparing the amplitude of the input signal to a lower and an upper limit of an amplitude window;

indicating whether the amplitude of the analog input signal is between the lower and the upper limits of the amplitude window; and using the indication to determine whether the analog input signal belongs to at least one of a plurality of pre-determined classes of analog signals.

4. The method of claim 3, wherein the input signal is provided by an analog signal source.

5. The method of claim 4, wherein the analog signal source comprises live neural tissue.

6. The method of claim 4, wherein the analog signal source comprises a photo sensor.

7. The method of claim 4, wherein the analog signal source comprises a pressure sensor.

8. The method of claim 4, wherein the analog signal source comprises a thermal sensor.

9. The method of claim 4, wherein the analog signal source comprises a seismic motion sensor.

10. The method of claim 3, wherein waiting an amount of time comprises using a time delay module to delay a processing of the input signal.

11. The method of claim 3, wherein the comparing of the amplitude of the input signal to a lower and an upper limit of an amplitude window comprises using an analog comparator component for the comparison.

12. The method of claim 3, wherein the lower and the upper limits of the amplitude window are stored in a second and a third analog memory component, respectively.

13. A method for detection of patterns of signals, the method comprising:

receiving a plurality of analog input signals;

in response to receiving each one of the plurality of analog input signals, detecting an amplitude of each one of the analog input signals crossing a corresponding threshold;

for each of a plurality of positive amplitude peaks and each of a plurality of negative amplitude peaks of each of the plurality of the analog input signals, respectively:

waiting a corresponding amount of time, stored in a corresponding first analog memory component, and comparing the positive amplitude peak and the negative amplitude peak of each of the plurality of analog input signals, respectively, to one of a plurality of lower limits and one of a plurality of upper limits, respectively, of a plurality of corresponding amplitude windows;

indicating whether each of the positive amplitude peaks and each of the negative amplitude peaks of each of the analog input signals is between the corresponding one of the plurality of the lower limits and the corresponding one of the plurality of the upper limits; and determining, based on the indication for each of the analog input signals, whether each of the analog input signals matches one of a plurality of predetermined signal patterns.

14. The method of claim 13, wherein each of the plurality of the input signals is provided by an analog signal source.

15. The method of claim 13, wherein each of the plurality of the positive amplitude peaks and each of the plurality of the negative amplitude peaks is stored in a corresponding second and third analog memory component, respectively.

16. The method of claim 13, wherein the plurality of the input signals are received by a corresponding plurality of analog signal classifiers organized in a row-addressable and column-addressable array of signal classifiers.

17. The method of claim 16, wherein an output of the array of signal classifiers is multiplexed to provide an output signal of a signal classifier corresponding to a selected row and a selected column of the array of signal classifiers.

18. The method of claim 16, wherein the output of the array of signal classifiers is provided to a signal processor for performing further computations on the plurality of the input signals.

19. A method for classification of signals, the method comprising:

storing an analog threshold value in a first analog memory component;

storing an analog value, based on which a corresponding time-delay value is determined, in a second analog memory component;

storing an analog lower limit of an amplitude window in a third analog memory component;

storing an analog upper limit of an amplitude window in a fourth analog memory component;

receiving an analog input signal;

in response to receiving the analog input signal, detecting an amplitude of the analog input signal crossing the analog threshold value;

in response to detecting the amplitude of the analog input signal crossing the analog threshold value, waiting an amount of time equal to the analog time-delay value and comparing the amplitude of the analog input signal to the analog lower limit and the analog upper limit of the amplitude window;

indicating whether the amplitude of the analog input signal is between the analog lower limit and the analog upper limit of the amplitude window; and using the indication to determine whether the analog input signal belongs to at least one of a plurality of pre-determined classes of analog signals.

20. The method of claim 19, wherein the first, second, third, and fourth analog memory components comprise a floating gate of a transistor.

21. The method of claim 19, wherein the analog input signal is provided by an analog signal source.

22. The method of claim 19, wherein the storing of the analog threshold value, the analog time-delay value, the analog lower limit, and the analog upper limit is performed via a controller module coupled with the first, second, third, and fourth analog memory components, respectively.

* * * * *